United States Patent
Wertz et al.

(10) Patent No.: US 7,090,507 B2
(45) Date of Patent: Aug. 15, 2006

(54) SOCKET HAVING SUBSTRATE LOCKING FEATURE

(75) Inventors: Darrell L Wertz, York, PA (US); Robert T Frederick, Enola, PA (US); Richard N Whyne, Camp Hill, PA (US); Andrew D Balthaser, Dauphin, PA (US); Alan A Kordas, Lewisberry, PA (US); Peter C O'Donnell, Dillsburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/788,874

(22) Filed: Feb. 27, 2004

(65) Prior Publication Data

US 2005/0191123 A1    Sep. 1, 2005

(51) Int. Cl.
*H01R 12/00* (2006.01)
(52) U.S. Cl. .............................. 439/68; 439/66; 439/71
(58) Field of Classification Search ............. 439/66–73
See application file for complete search history.

(56) References Cited

U.S. PATENT DOCUMENTS

| | | | |
|---|---|---|---|
| 5,793,618 A * | 8/1998 | Chan et al. ................. | 361/809 |
| 6,210,176 B1 * | 4/2001 | Hsiao ........................... | 439/71 |
| 6,280,202 B1 * | 8/2001 | Alden et al. .................. | 439/66 |
| 6,375,476 B1 * | 4/2002 | Goodwin et al. ............. | 439/71 |
| 6,390,826 B1 * | 5/2002 | Affolter et al. ............... | 439/70 |
| 6,659,778 B1 * | 12/2003 | Li ................................ | 439/66 |
| 6,699,047 B1 * | 3/2004 | McHugh et al. ............. | 439/71 |
| 6,881,073 B1 * | 4/2005 | Bali et al. ..................... | 439/70 |
| 6,923,656 B1 * | 8/2005 | Novotny et al. .............. | 439/66 |
| 6,945,788 B1 * | 9/2005 | Trout et al. ................... | 439/66 |
| 2002/0102868 A1 * | 8/2002 | Li ................................ | 439/66 |

* cited by examiner

*Primary Examiner*—Michael C. Zarroli

(57) ABSTRACT

A socket is shown having an insulative housing surrounding a metal substrate. The substrate has an array of apertures which are located in spatially arranged order to accommodate the precise pattern desired for the device to be connected. Contact assemblies include stamped and formed contacts having an insulative plastic molded over a central section of the contact. The molded inserts are receivable in the apertures of the substrate and are later swaged to retain them and the contacts to the substrate. The substrates are located relative to a mating device by way of pins attached to the substrate. The pins are locked to the substrate by way of a locking device, whereby the pins are rotated and locked in place.

15 Claims, 20 Drawing Sheets

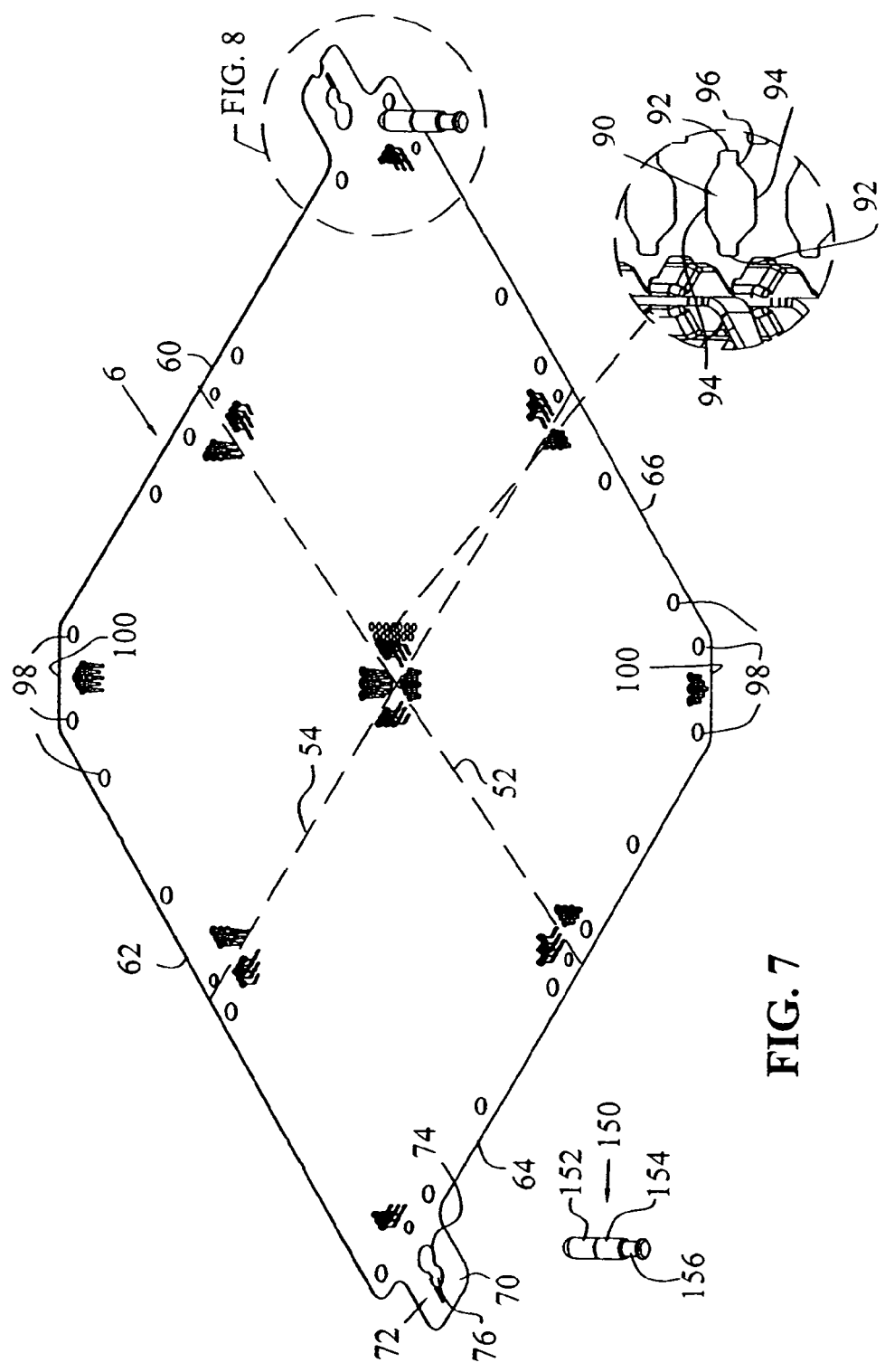

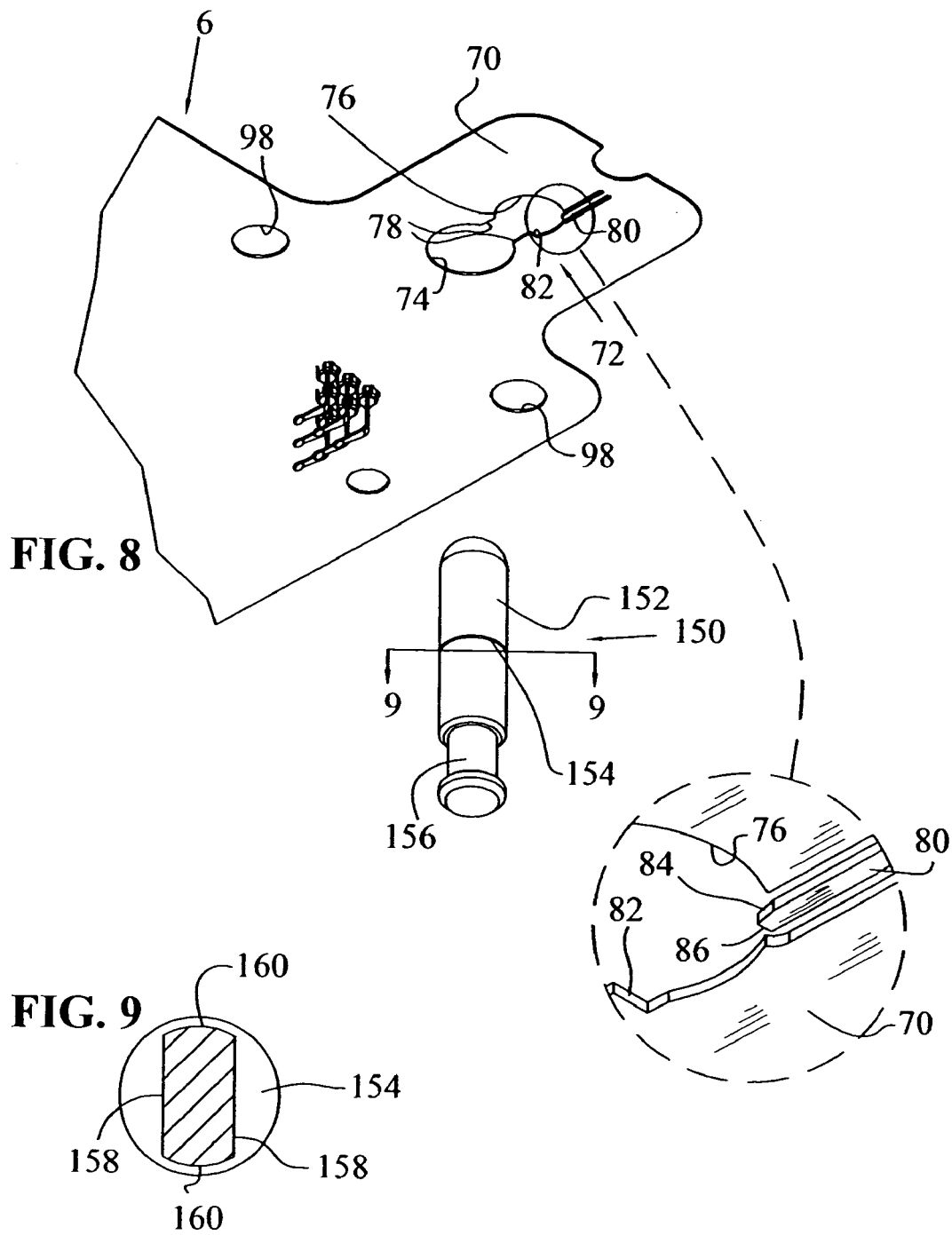

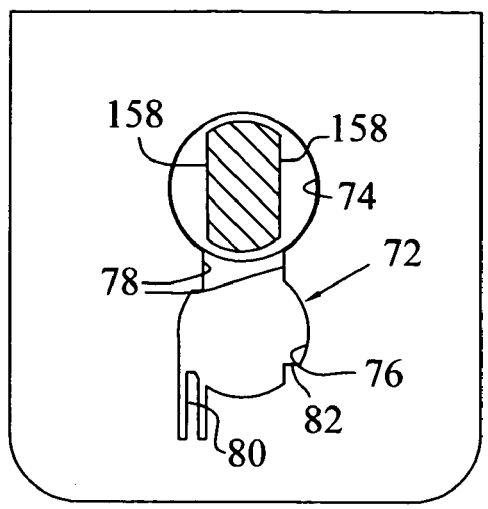
FIG. 17
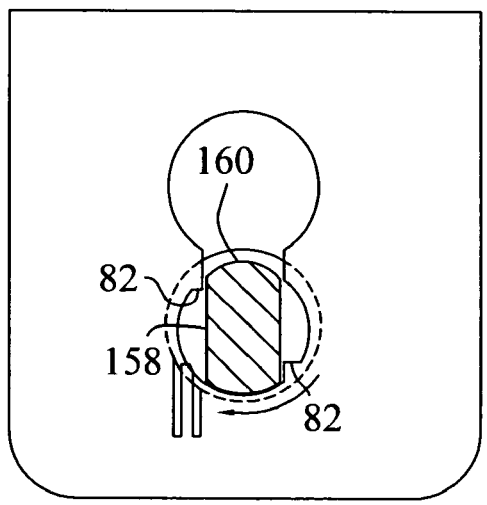
FIG. 19
FIG. 20
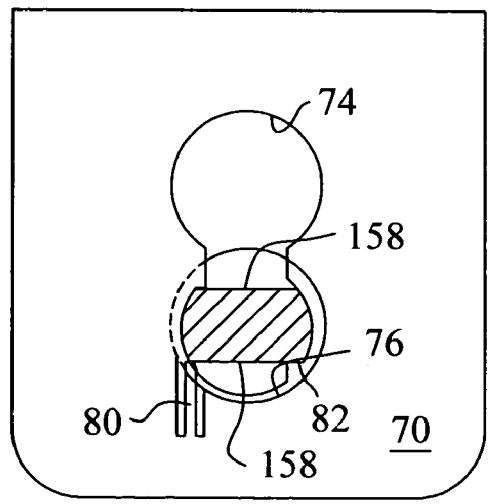

SOCKET HAVING SUBSTRATE LOCKING FEATURE

BACKGROUND OF THE INVENTION

The subject invention relates to a Land Grid Array (LGA) socket and a method of manufacturing the same.

Various packages or devices exist within the computer industry which require interconnection to a printed circuit board. These devices have lands or balls which are placed on 1.0-mm centerline spacing and below. These devices are profiled with arrays of 50 by 50 and even greater. Given the plurality of lands, their centerline spacing, and given the force applied to each land, this device causes a variety of problems in practice in connection to the printed circuit board.

Sockets exist within the market for the interconnection of such devices, where the sockets include columns of conductive polymer allowing the interconnection between the devices and the printed circuit boards. However, these devices too can cause some problems. For example, the conductive polymers can creep over time, and after temperature exposure and thermal cycling. Therefore, its elasticity is reduced, and the normal force, which is applied to the contact interface, is also reduced.

These and other problems are addressed by the present invention.

SUMMARY OF THE INVENTION

The objects of the invention have been accomplished by providing an assembly comprising a pin and a substrate, the substrate having a receiving aperture, the receiving aperture having a receiving portion which transitions into a locking portion. The pin is profiled for insertion into the receiving portion and is further profiled for transverse movement into the locking portion, whereby the pin and locking portion are cooperatively profiled for locking the pin in a fixed position to the substrate.

The pin is substantially cylindrical, and the receiving portion and locking portion are substantially circular. The pin is rotated into the locked position. The pin includes an undercut groove, which, when aligned with the locking portion, allows the transverse movement of the pin into the locking portion. The receiving aperture includes a channel section at the intersection of the receiving portion and the locking portion. The undercut groove includes flat edge portions defined by parallel chordal edges, profiled to be received in the channel section. The channel section is provided by straight edges extending between the receiving portion and the locking portion. The straight edges includes a transverse stop edge.

The assembly also has an edge opposite the transverse stop edge which is provided with a latch member, whereby when the pin is rotated to a position where one of the chordal edges abuts the transverse stop edge, the other of the chordal edges is locked in position against the latch member, and the pin is held longitudinally fixed to the substrate. The latch is defined by an elongate latch member, etched from the substrate and extending part way into the locking portion.

In another aspect of the invention, an LGA interconnect, for interconnection to further electrical components, comprises a substrate having an array of contact receiving openings therein, and the substrate has a receiving aperture, the receiving aperture having a receiving portion which transitions into a locking portion. A plurality of contact assemblies are positioned and retained in the substrate. A frame housing is positioned around a periphery of the substrate. Alignment members project from the substrate, and extend through the frame housing, for aligning the substrate relative to at least one of the electrical components, the alignment members being insertable into the receiving opening and locked in place in the locking portion.

The alignment members are comprised of pins, and are attached at diametrically opposite positions of the substrate. The frame housing can laterally float relative to the pins. The frame housing is comprised of first and second frame parts attached to each other. The pin is substantially cylindrical. The receiving portion and locking portion are substantially circular, and the pin is rotated into the locked position. The pin includes an undercut groove, which, when aligned with the locking portion, allows the transverse movement of the pin into the locking portion. The receiving aperture includes a channel section at the intersection of the receiving portion and the locking portion.

The undercut groove includes flat edge portions defined by parallel chordal edges, profiled to be received in the channel section. The channel section is provided by straight edges extending between the receiving portion and the locking portion. The straight edges includes a transverse stop edge. An edge opposite the transverse stop edge is provided with a latch member, whereby when the pin is rotated to a position where one of the chordal edges abuts the transverse stop edge, the other of the chordal edges is locked in position against the latch member, and the pin is held longitudinally fixed to the substrate. The latch is defined by an elongate latch member, etched from the substrate and extending part way into the locking portion.

BRIEF DESCRIPTION OF THE DRAWINGS

FIG. 7 shows a perspective view of the substrate of the embodiment;

FIG. 8 shows an enlarged view of the area denoted in FIG. 7;

FIG. 9 shows a cross-sectional view through lines 9—9 of FIG. 8;

FIG. 17 is a cross-sectional view through lines 17—17 of FIG. 16;

FIG. 19 is a cross-sectional view similar to that of FIG. 17, showing the pin transitioning to the locked position;

FIG. 20 is a cross-sectional view similar to that of FIGS. 17 and 19, showing the pin in the locked position;

DETAILED DESCRIPTION OF THE PREFERRED EMBODIMENT

The subject invention relates to a Land Grid Array (LGA) interconnect socket and a method of manufacturing the same. When used herein, the term LGA is meant to define many different interconnects. For example, it could be interpreted to mean a chip interconnected to a printed circuit board. However, it can also mean a board to board interconnect. In this application, the invention will be described by way of an interconnect to a chip.

Figure 1:
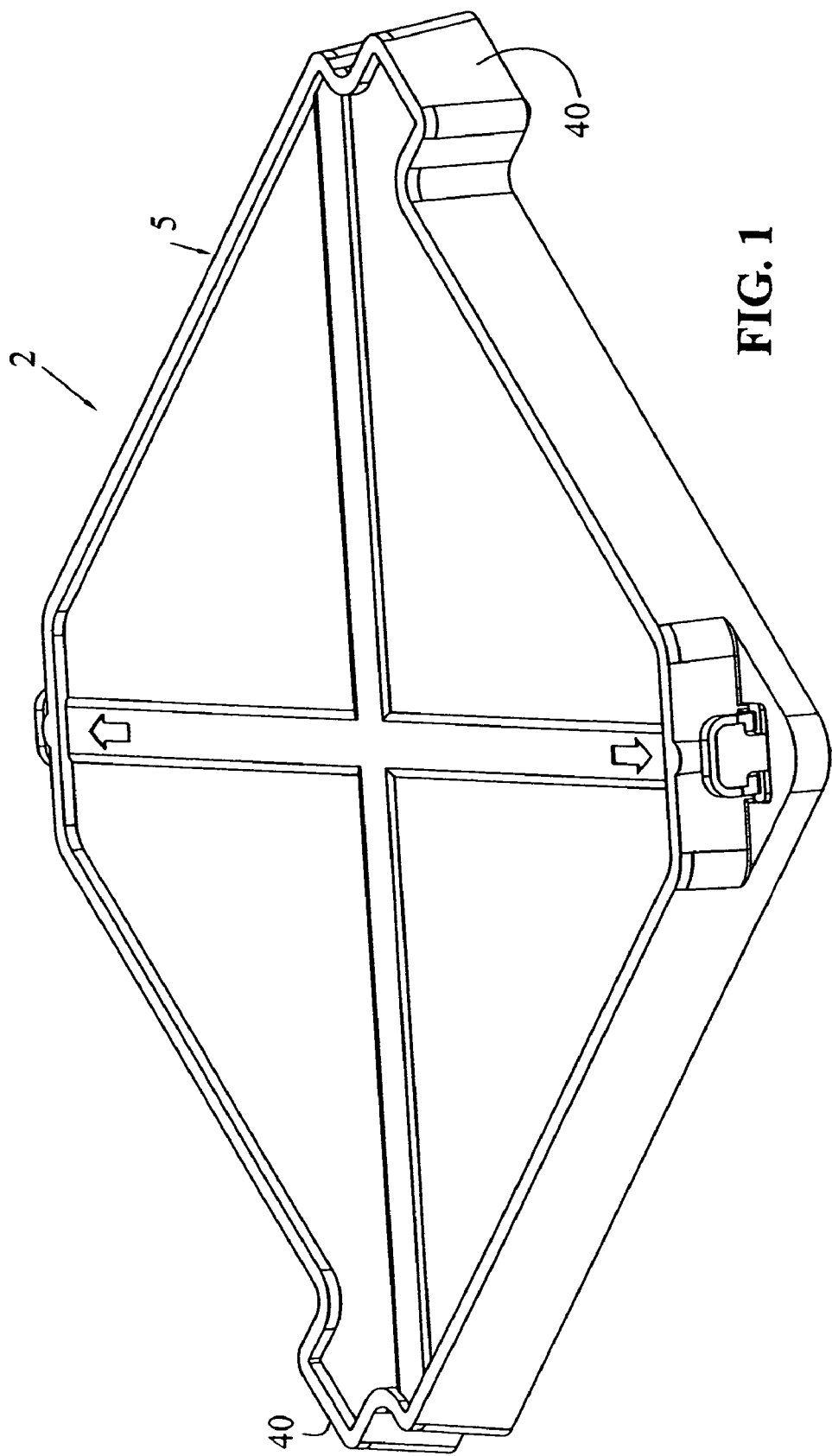
FIG. 1 shows a top perspective view of another embodiment of the LGA interconnect of the present invention.
Figure 2:
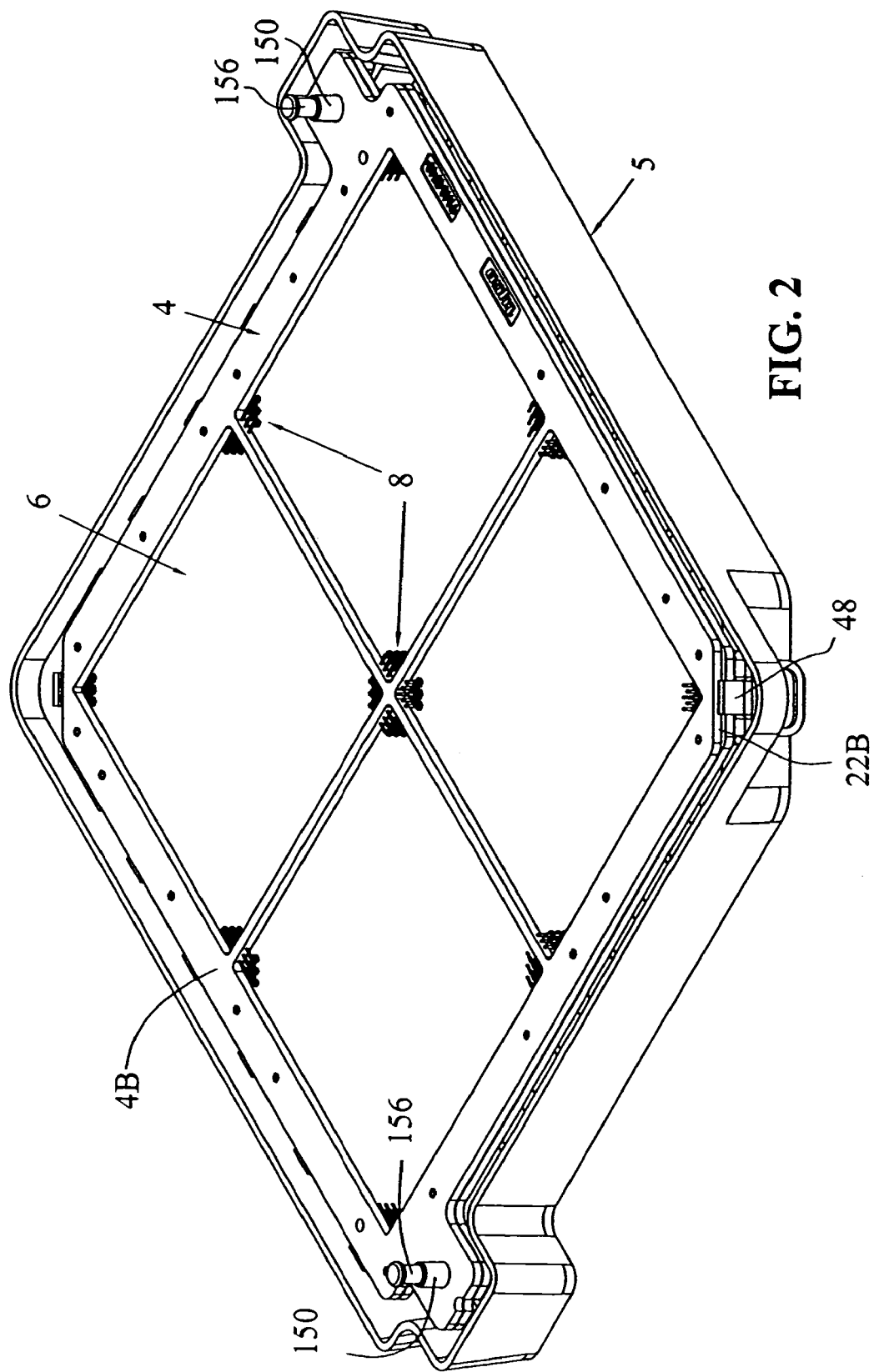
FIG. 2 shows a lower perspective view of the embodiment of FIG. 1.
Figure 3:
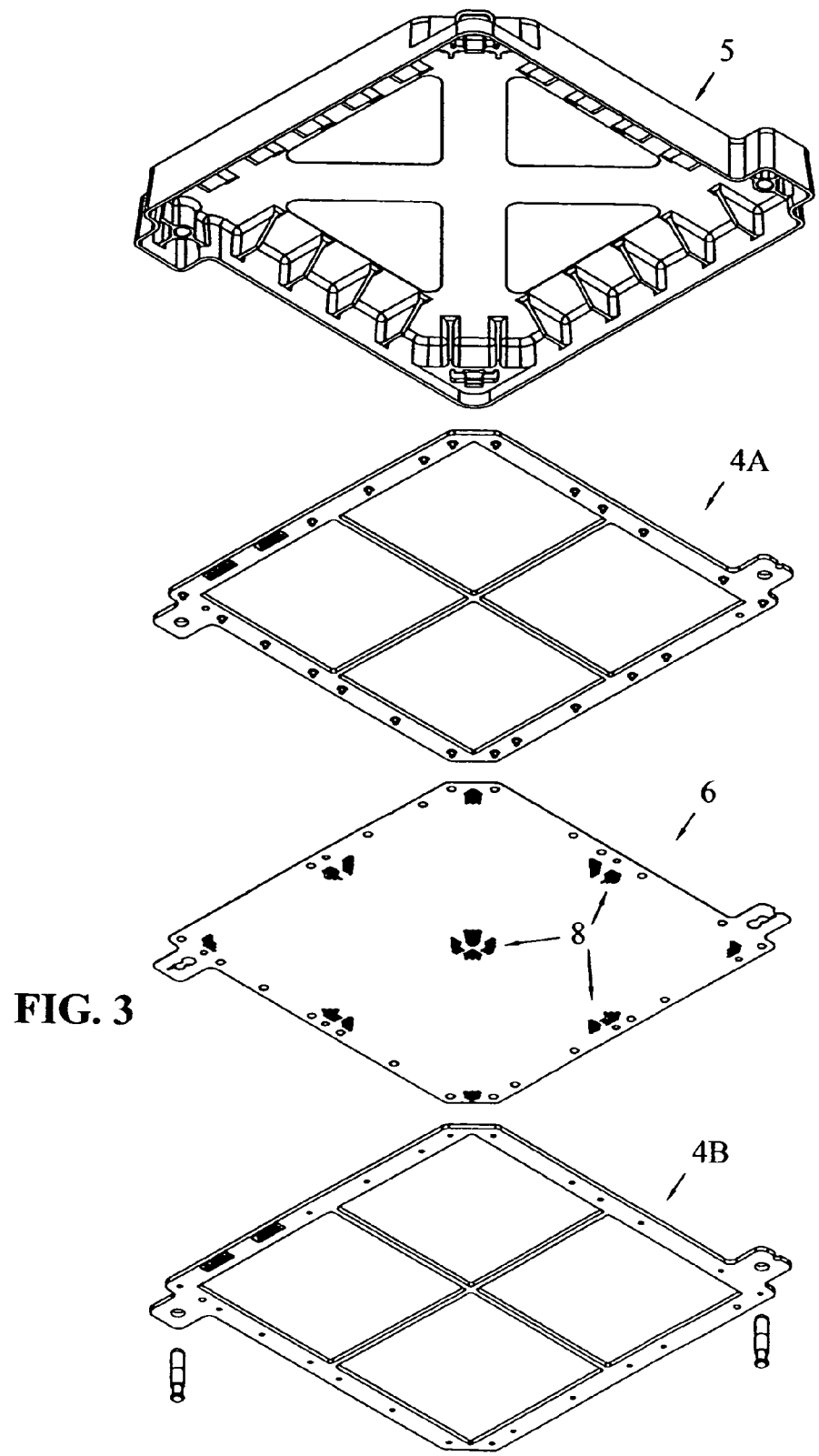
FIG. 3 shows an exploded view of the various components of the embodiment of FIG. 1.
Figure 4:
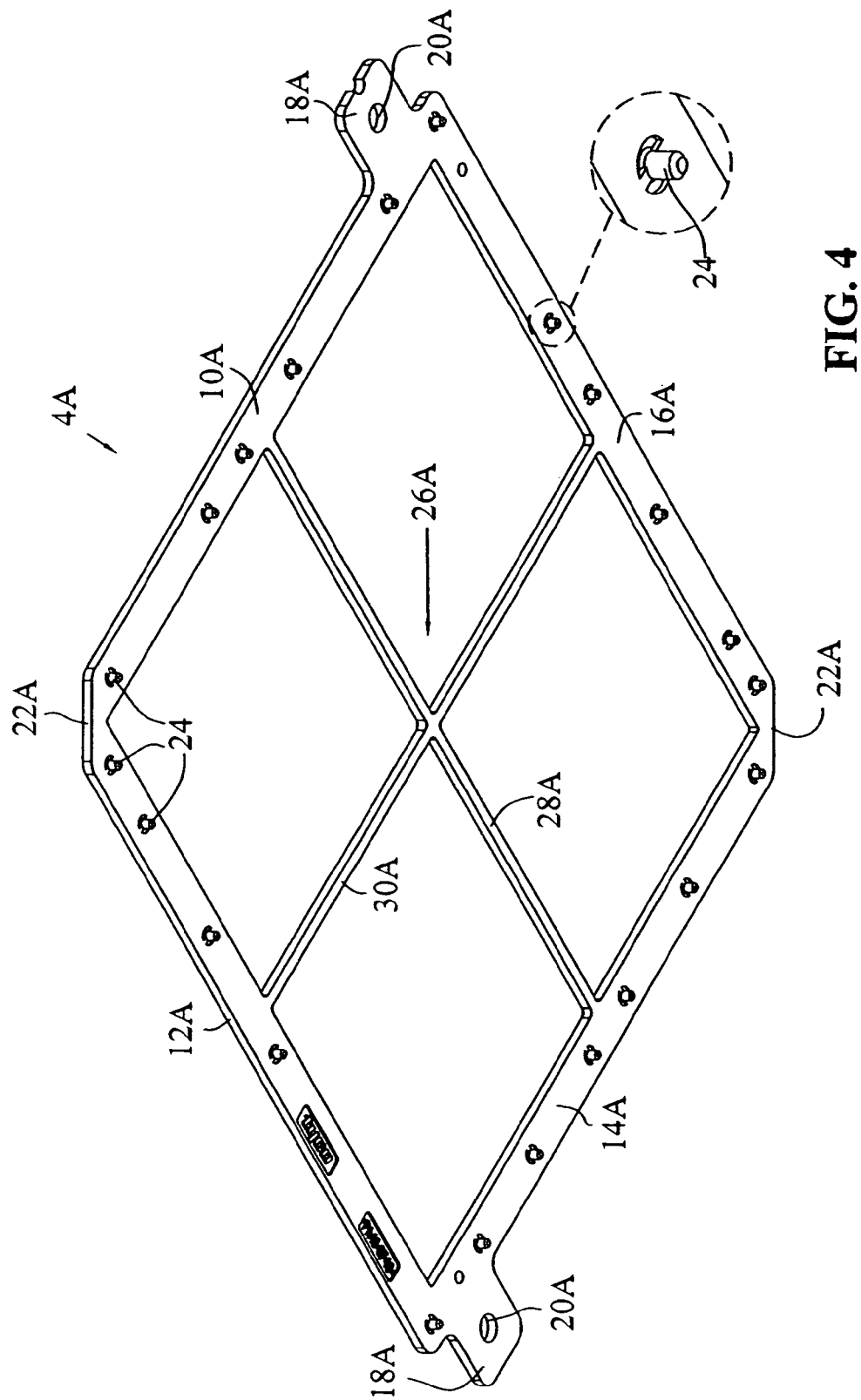
FIG. 4 shows a perspective view of a first frame member.

With respect first to FIGS. 1–3, the LGA interconnect is shown at 2 and includes a frame housing 904 comprised of first and second frame members 4A and 4B (FIG. 3), a cover 5, and a substrate 6 which carries a plurality of contact assemblies 8. With reference now to FIG. 4, frame housing portion 4A will be described in greater detail.

Frame housing portion 4A includes frame side wall portions 10A, 12A, 14A, and 16A. Frame housing portion 4A further includes extension ears 18A extending from diametrical corners having pin-receiving apertures 20A, as will be described further herein. At the other diametrical corners, frame housing portion 4A includes edges 22A. Alignment pins 24 extend downwardly from the frame housing 4A and are substantially cylindrical in cross section. Finally, frame support members 26A extend between opposing side edges of the frame housing 4A and is cruciform in configuration having a first member 28A and a second member 30A defining quadrants therebetween.

Figure 5:
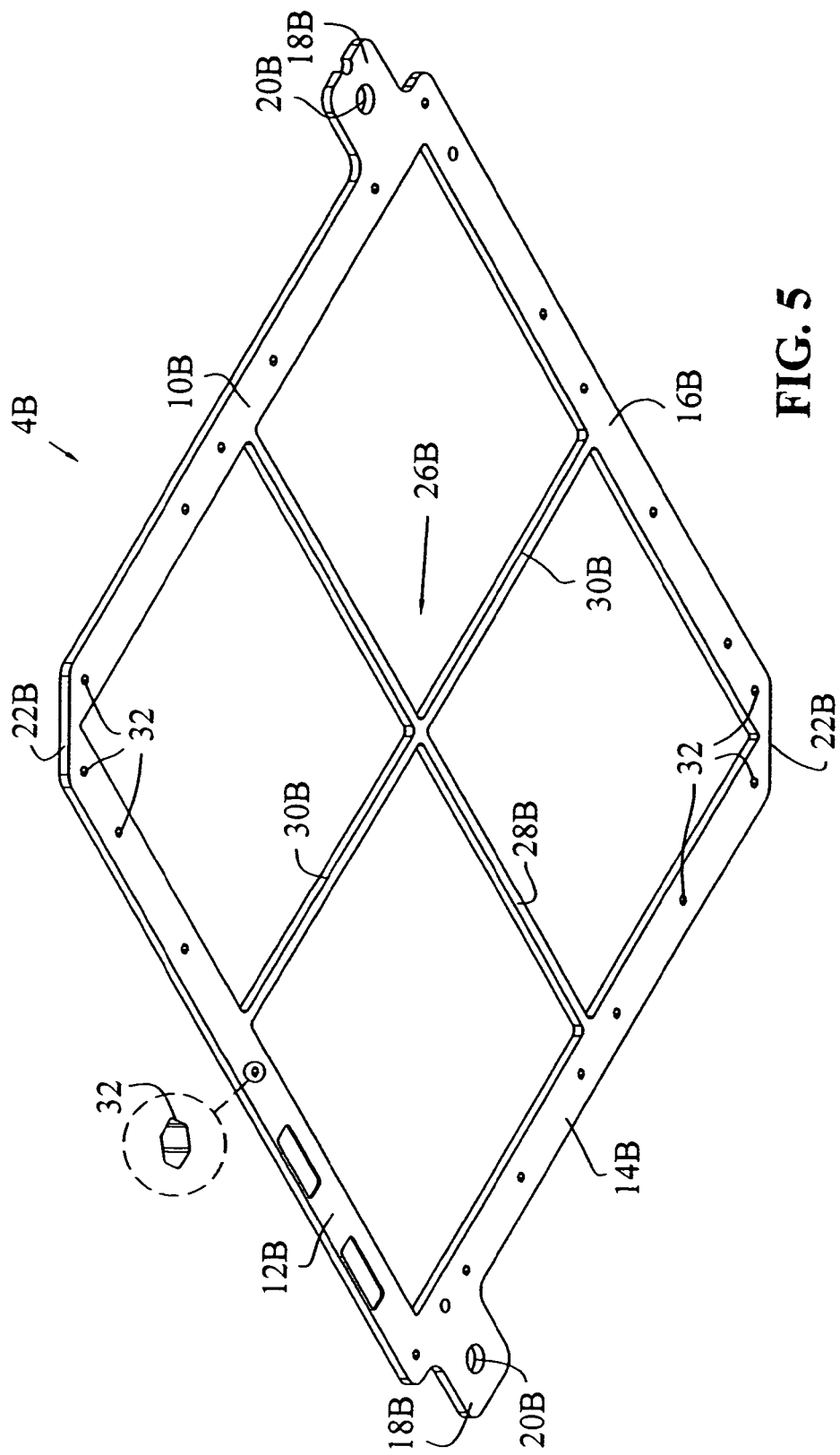
FIG. 5 shows a lower perspective view of a second frame member of the present embodiment.

With respect now to FIG. 5, frame housing portion 4B will be described in greater detail. It should be appreciated that frame housing portion 4B is complementary to frame housing portion 4A and is designed to trap therebetween the substrate member 6. With respect to FIG. 5, frame housing portion 4B includes side edge portions 10B, 12B, 14B, and 16B. In a similar manner to frame housing portion 4A, frame housing portion 4B includes extension ears 18B extending from diametrical corners having apertures 20B. The other corners include edges 22B. Frame housing portion 4B also includes frame support member 26B, having support members 28B and 30B. Finally, as shown in FIG. 5, frame housing portion 4B includes a plurality of hexagonal openings 32 in an array which matches the array of pins 24 on housing member 4A.

Figure 6:
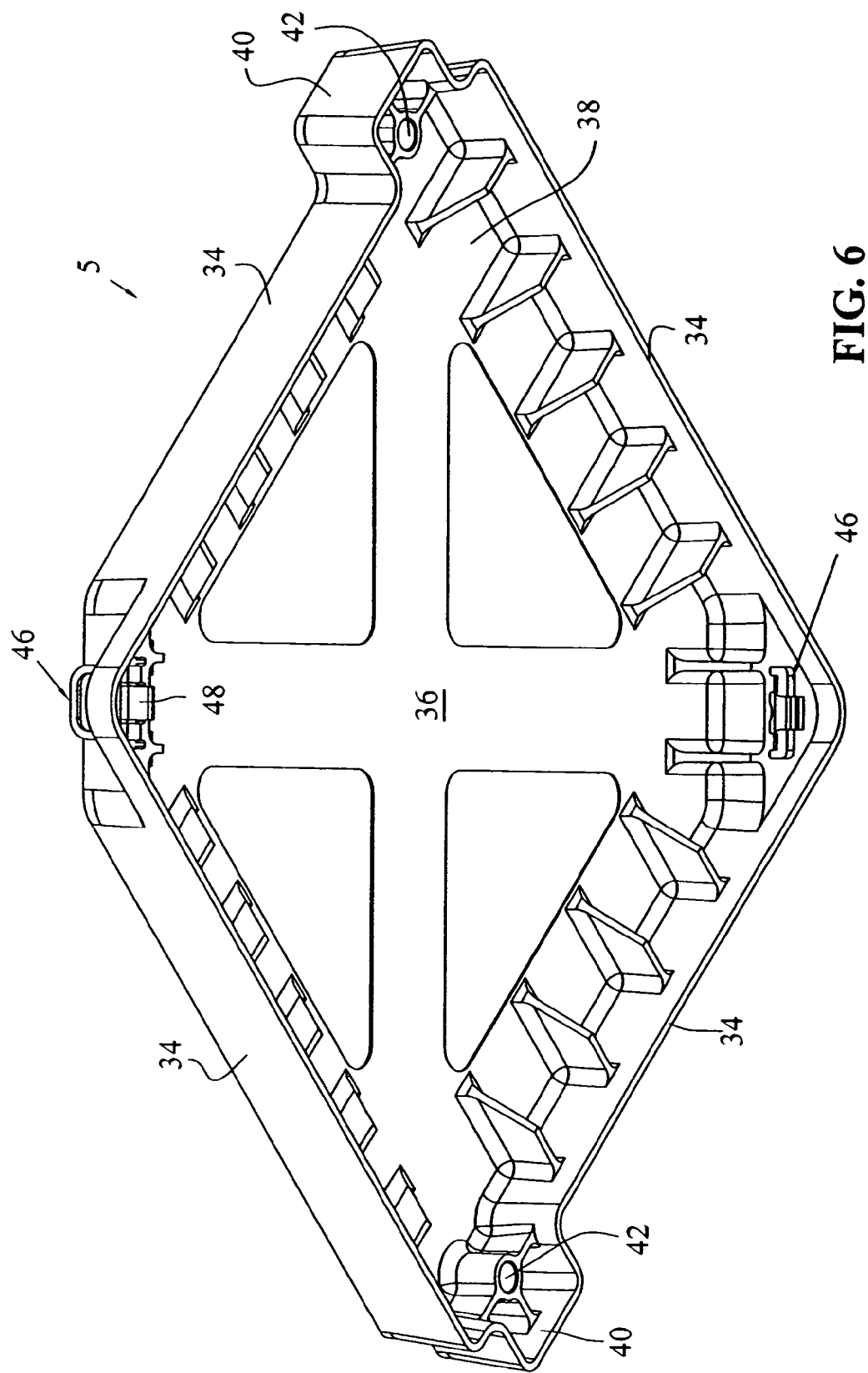
FIG. 6 shows an enlarged perspective view of the cover of the embodiment of FIG. 1.

With respect now to FIG. 6, cover 5 will be described in greater detail. As shown in FIG. 6, in an underside perspective view, cover 5 includes side walls 34 and top wall 36 defining an enclosure 38 therein. It should be appreciated that cover 5 is profiled to be received over the combination of frame housing portions 4A, 4B and the substrate 6. Thus, at each corner of cover 5, an extension portion 40 is provided and is profiled to be received over extension ears 18A and 18B. As best shown in FIG. 6, these extensions include apertures 42 for alignment purposes with the substrate directly as will be further described herein. In the opposite corners, latch members 46 are provided having latching arms 48, as best shown in FIGS. 2 and 6, and as will be described in further detail herein.

With respect now to FIG. 7, substrate member 6 will be described. As shown in FIG. 7, substrate 6 is substantially rectangular in configuration. In fact, as shown in FIG. 7, substrate 6 is substantially square in cross section so as to define four equal quadrants, as will be described herein. Substrate 6 includes side edges 60, 62, 64, and 66. With respect now to FIG. 7, substrate 6 includes an extension ears 70 at diametric opposite corners of the substrate 6. With reference now to FIG. 8, extension ear 70 is shown in greater detail having an aperture 72 having a FIG. 8 configuration. Aperture 72 includes an enlarged opening at 74 transitioning into a smaller opening 76 by way of a channel section defined by flat transition edges at 78. A latch member 80 is provided extending into opening 76, and stop edges 82 are provided in diametrically opposed relation. Latch 80 includes a chamfered edge at 84 and a latching edge at 86, as will be described in greater detail.

As shown in FIG. 7, substrate 6 further includes a plurality of apertures 90, whereby the apertures are defined in an array of quadrants, whereby at the intersection of the quadrants, each of the contacts generally faces the center of the substrate. As shown in FIG. 7, each aperture 90 includes end edges 92, side edges 94 and angled side edges 96. These apertures are substantially similar to those described above with respect to FIG. 12 and are profiled to receive the contact assemblies 8 therein. With respect still to FIG. 7, apertures 98 are provided, which are in alignment with cylindrical pins 24, but are larger in diameter than the pins 24. Substrate 6 further includes a side edge 1000 at diametrical corners of the substrate 6, as will be described further herein.

Figure 10:
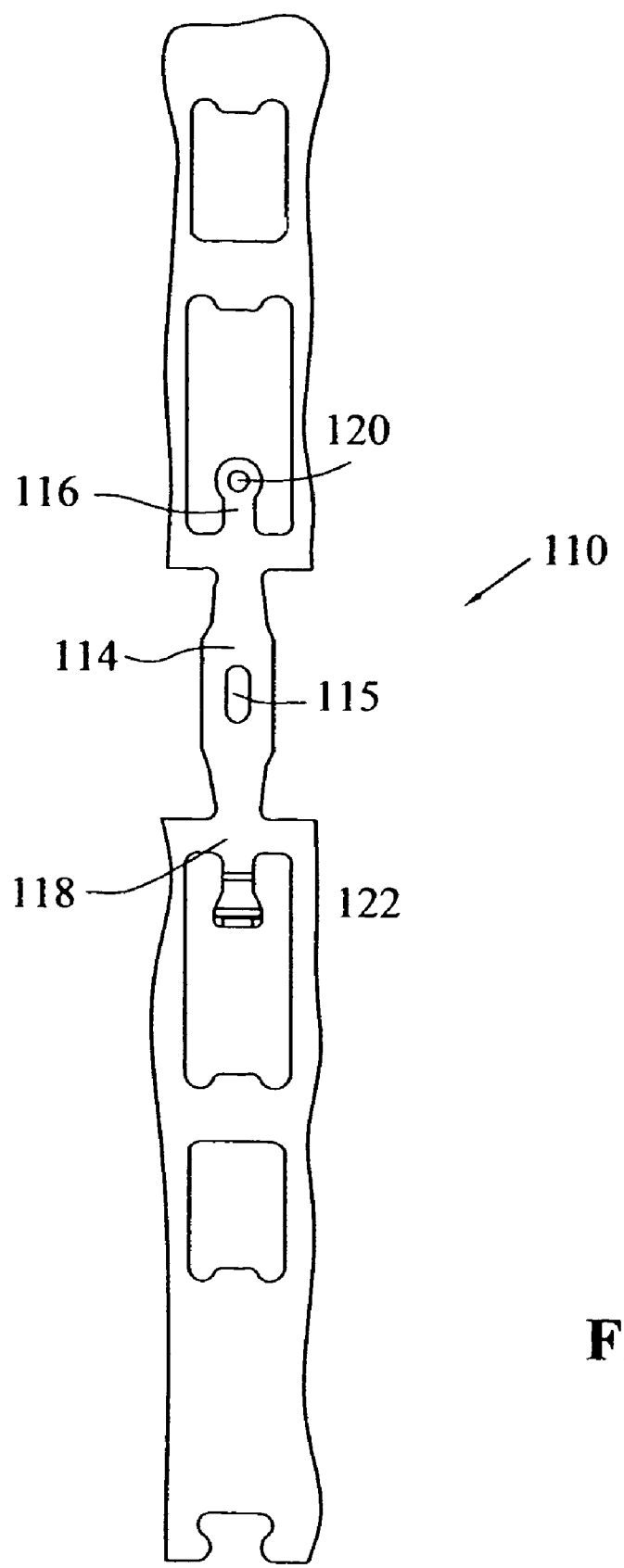
FIG. 10 shows a portion of a stamped lead frame showing the contact portion prior to overmolding the insert.
Figure 11:
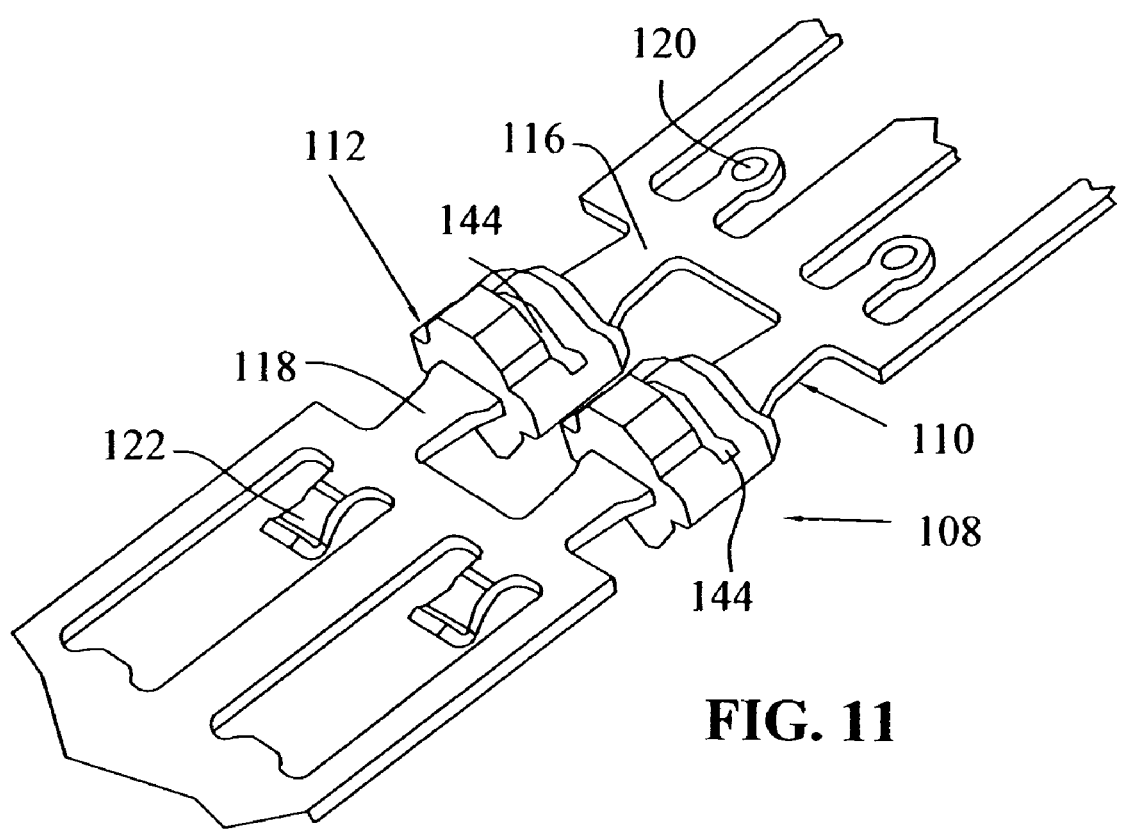
FIG. 11 shows the over-molded insert over the lead frame of FIG. 10.
Figure 12:
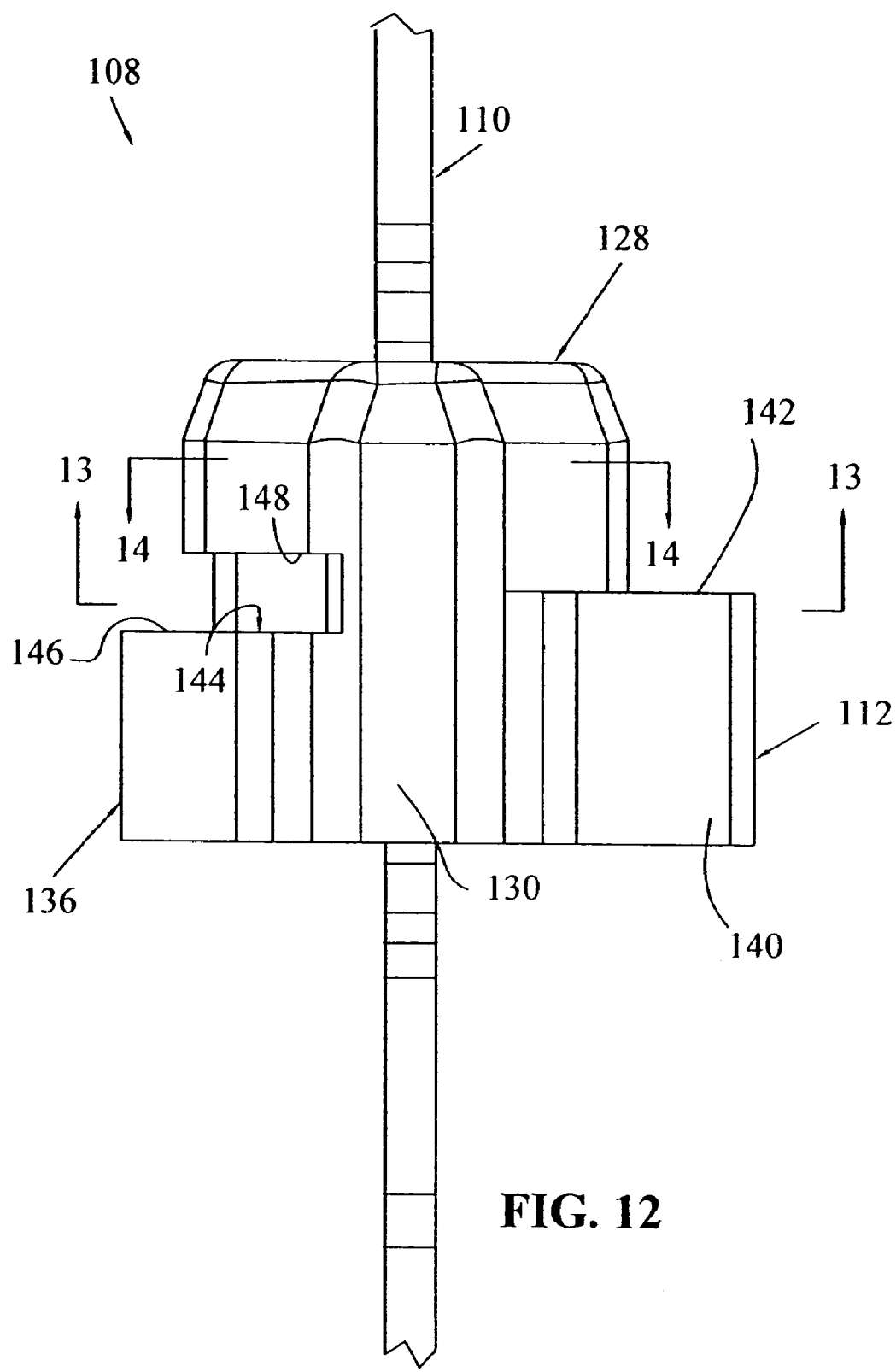
FIG. 12 shows a side view of the insert shown in FIG. 11.
Figure 13:
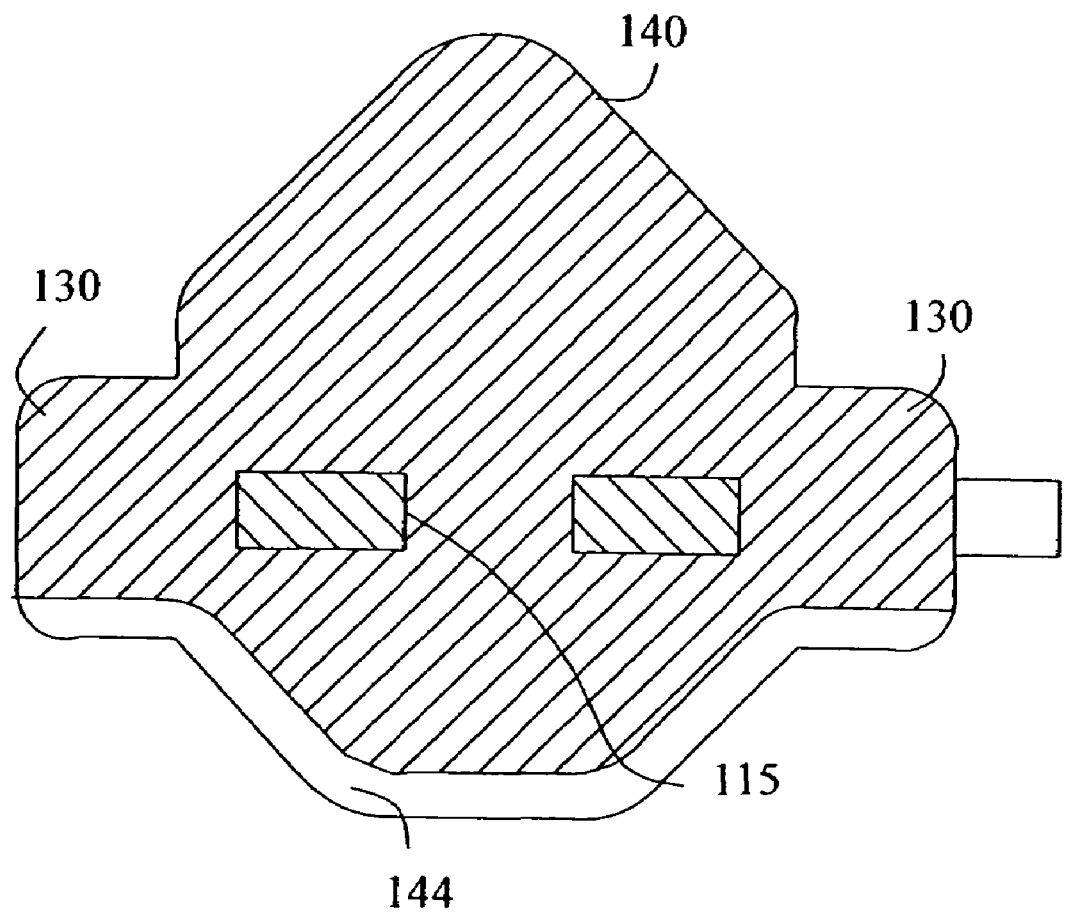
FIG. 13 is a cross-sectional view through lines 13—13 of FIG. 12.
Figure 14:
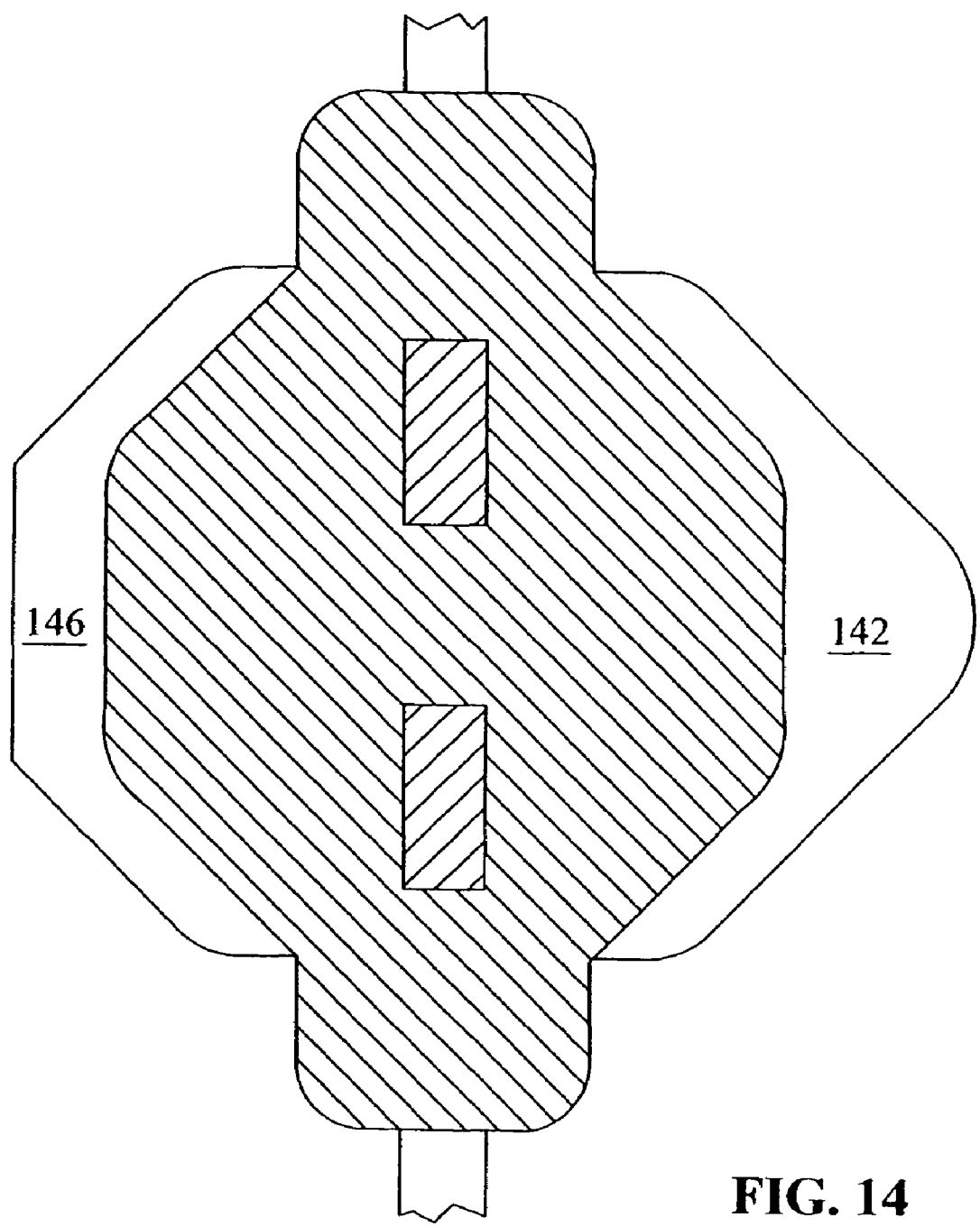
FIG. 14 is a cross-sectional view through lines 14—14 of FIG. 12.
Figure 15:
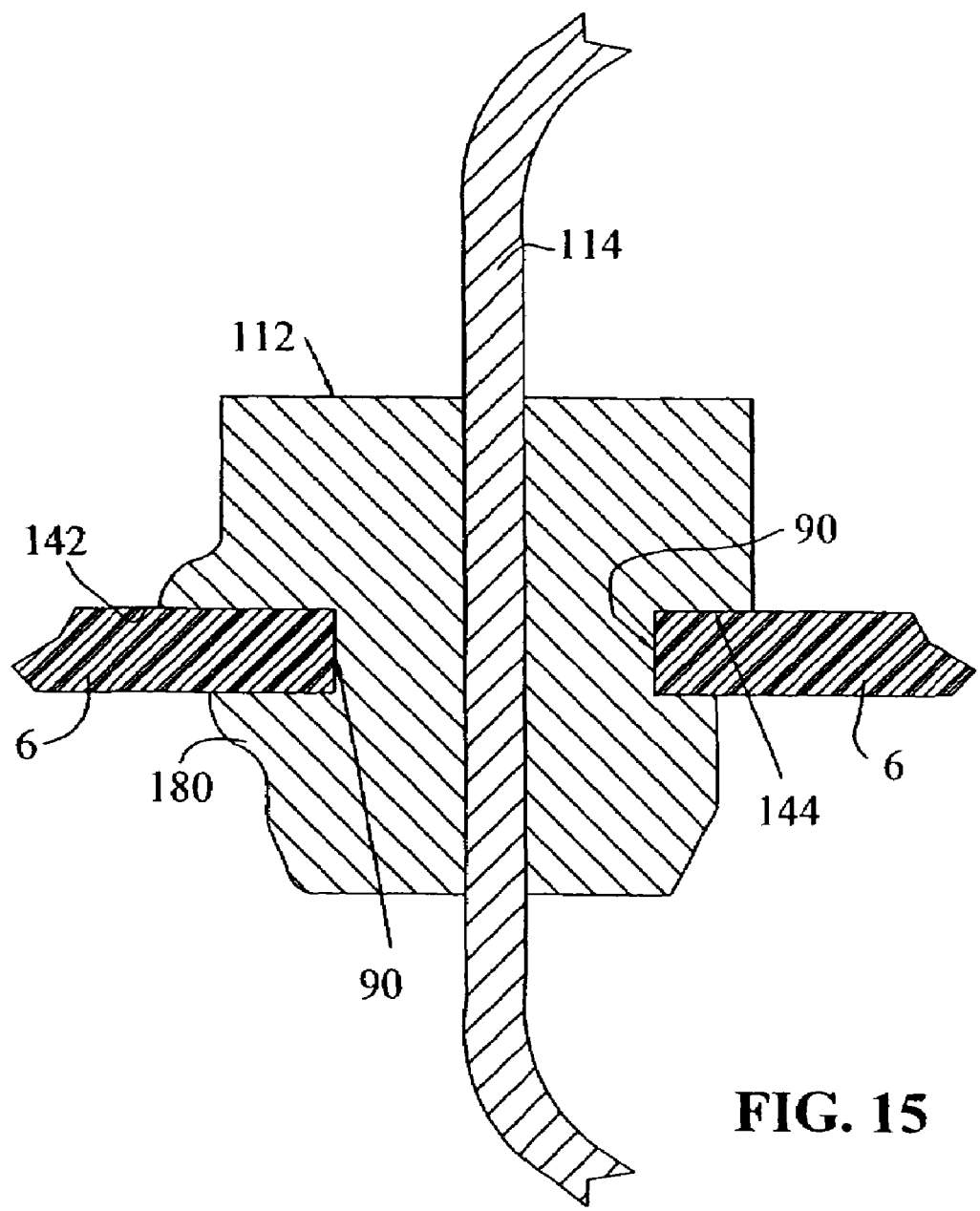
FIG. 15 is a cross-sectional view through the insert of FIG. 12, after the swaging process.

With respect now to FIGS. 10–14, contact assemblies 108 will be described in greater detail. As shown in FIG. 11, contact assembly 108 includes a stamped terminal portion 110 having an overmolded insert member 112 overmolded thereto. As shown in FIG. 10, the stamped terminal 110 includes a central portion 114 having an elongate aperture 115, with contact portions 116 and 118 extending from opposite sides thereof defining contact sections 120 and 122. With respect now to FIG. 12, insert 112 is shown molded onto terminal portion 110. It should be appreciated that insert 112 is substantially similar to that described above with respect to FIGS. 13–15B. That is, insert 112 includes a shank portion 128, end portions 130, head portion 136, and projecting portion 140. However, in addition, insert 112 includes a slot 144, which as shown in FIGS. 12 and 13, extends part way into end sections 130. Slot 144 defines opposing surfaces 146 and 148.

Finally, and with reference again to FIG. 8, interconnect 2 includes a locating pin 150 having a cylindrical pin portion 152, an undercut groove 154, and a reduced diameter portion at 156. As shown in FIG. 9, at the location of groove 154, the pin includes flat surfaces at 158, defining chordal edges, and reduced diameter surfaces at 160.

The substrate 6 is defined in a similar manner to that described above, where a substrate is defined with the characteristics shown in FIG. 7. While the substrate could be made from many different materials, such as Mylar, ceramic, plastic, or metal, this embodiment utilizes a stainless steel substrate, where the specific characteristics, such as the apertures 90 and the detail of apertures 98 and 72, are defined by an etching process. However, it should be recognized that some embodiments could be provided by a stamping process. In either event, in this embodiment apertures 90 are formed in quadrants about the substrate, as mentioned above.

With respect now to FIG. 10, the terminals are provided by a process to define a lead frame similar to that shown in FIG. 10. The contacts are defined by a metal having a spring characteristic, such as a beryllium copper, and is shown as being stamped and formed to define its characteristics. However, it should also be appreciated that an etching process could also be incorporated to accommodate tight tolerances as the contact density increases.

Insert 112, shown in FIG. 11, is now overmolded about the central portion 114 of the contact, whereby elongate aperture 115 is used as a sprue for the molten plastic to ensure a complete molded insert. The aperture 115 also provides for a retention mechanism for the insert longitudinally along the length of the terminal. The contact assemblies 108 are now inserted in their respective passageways 90, and it should be appreciated that slot 144, as shown in FIGS. 12 and 13, will conform within a respective aperture 90 to receive an edge of the aperture 90 therein. The inserts are now swaged in a manner similar to that described above with respect to FIGS. 22 and 23 above, whereby the plastic insert is deformed to a position shown in FIG. 15. The insert laterally shifts to position the edge of the aperture 90 within the slot 144, and with surfaces 142 and swaged projection 180 gripping the opposite edge of the substrate 6.

Figure 16:
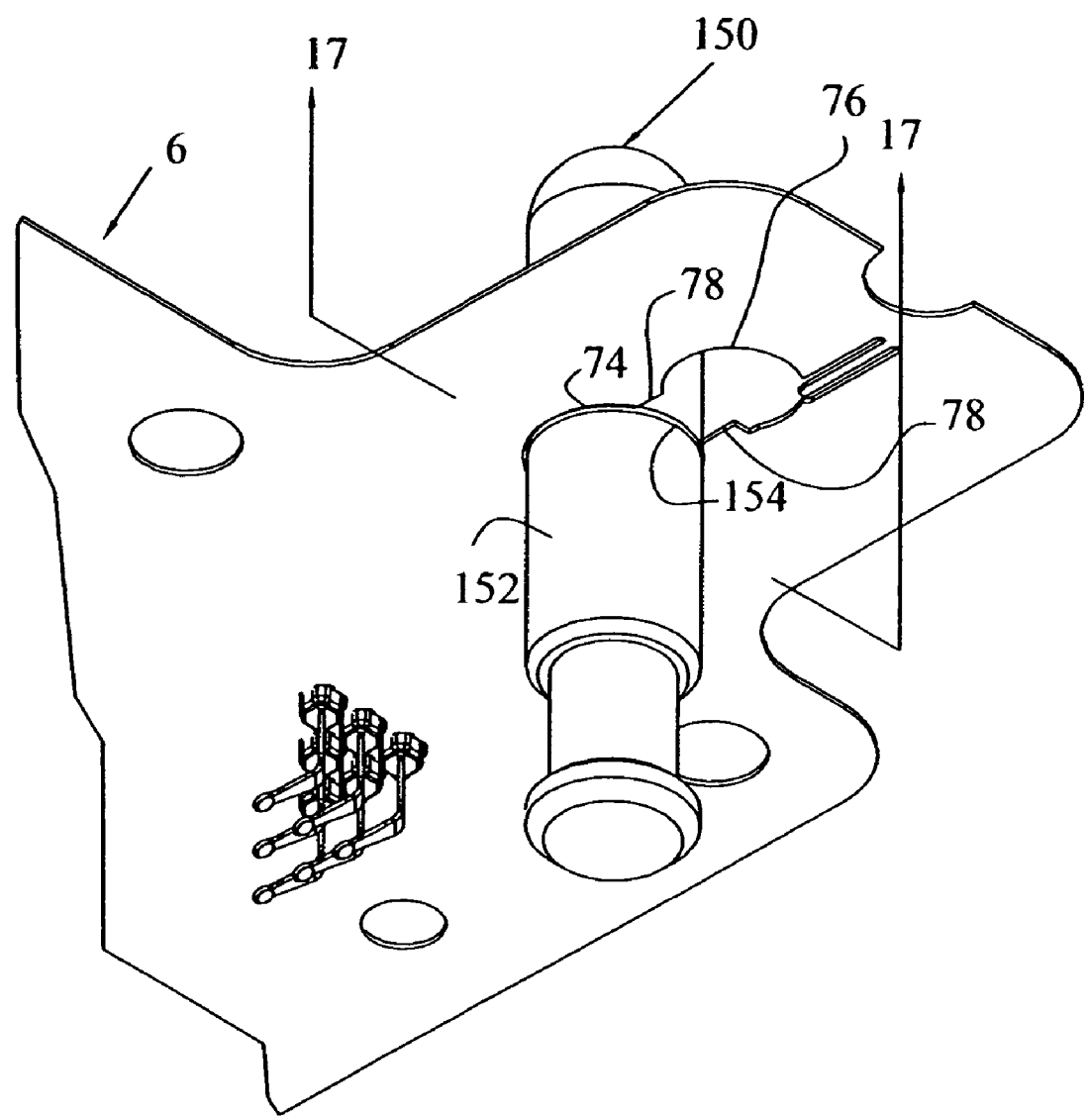
FIG. 16 is a view similar to that of FIG. 8, showing the pin in the first installed position.
Figure 18:
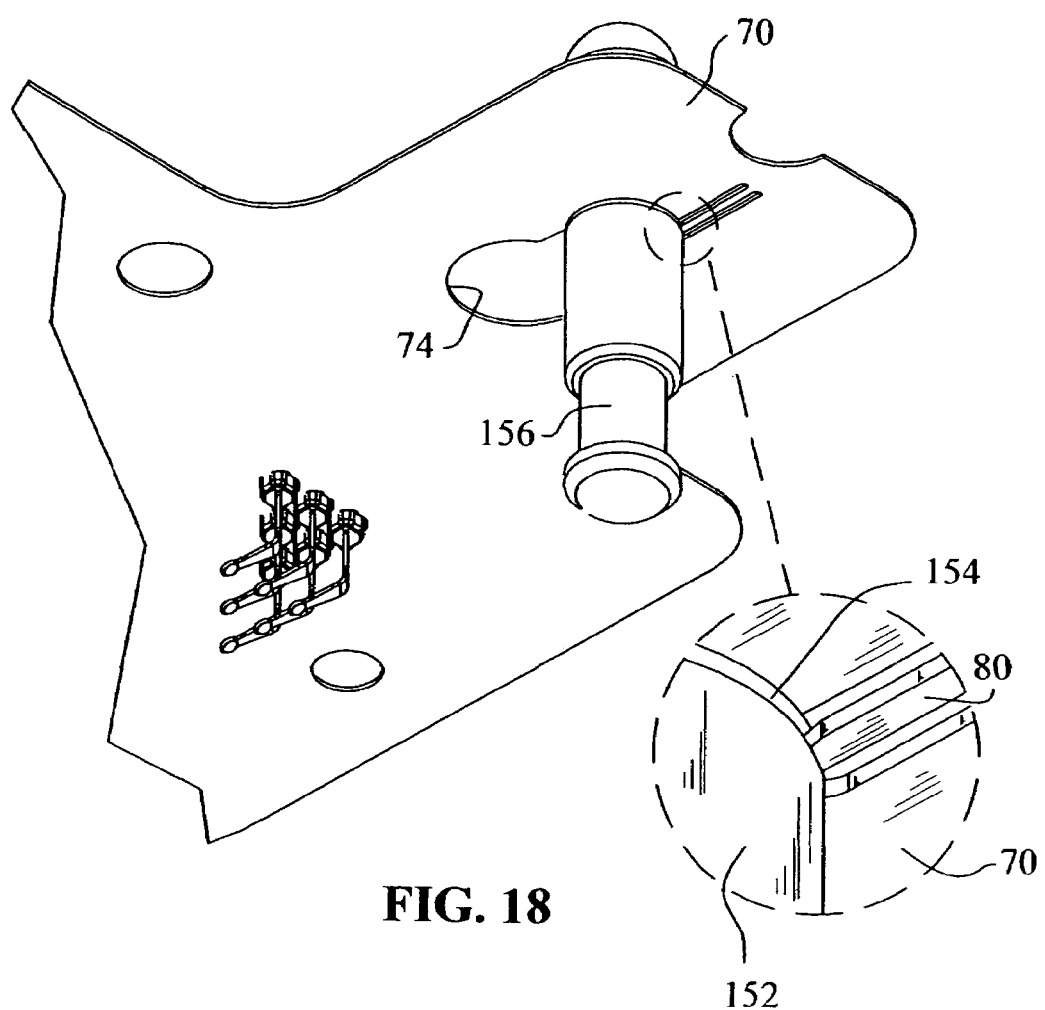
FIG. 18 is a view similar to that of FIG. 16, showing the pin in the next position.

Alignment pins 150 may now be inserted into their fixed position on substrate 6 by moving the alignment pins 150 from the position shown in FIG. 8, to the position shown in FIG. 16. It should be appreciated that the diameter of pin portion 152 is less than the diameter of aperture 74 and thus, pin 150 can be inserted into the aperture 74, as shown in FIG. 16, with groove 154 aligned with edges 78. As shown in the cross-sectional view of FIG. 17, at this position, the flat edges 158 can be aligned with edges 78 of aperture 72 and the pin can be moved from the position shown in FIG. 16 to the position shown in FIG. 18. With reference now to FIG. 19, when the pin 150 is moved to aperture 76, the diameter of radiused portions 160 is less than the diameter of aperture 76, and therefore the pin can be rotated in the clockwise sense as viewed in FIG. 19, by one-quarter turn, to the position in FIG. 20, where each of the flat edges 158 abut stop edges 82, and one of the flat edge 158 is trapped against edge 86 (FIG. 8) of latch arm 80. Two stop edges help to provide axial symmetry of the aperture 72, preventing the aperture from opening up when the pin is overtorqued.

Figure 21:
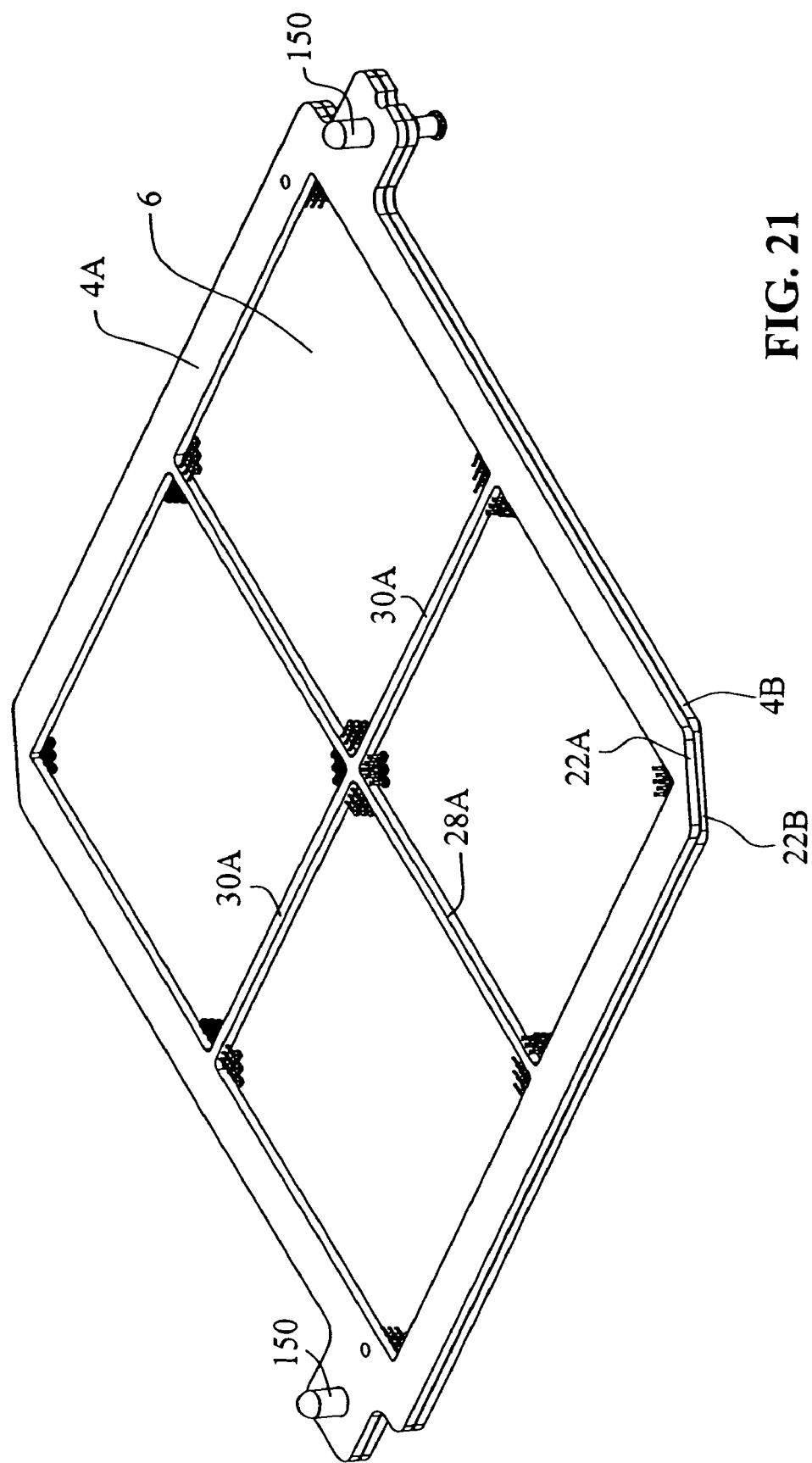
FIG. 21 is a perspective view of the assembled substrate and upper and lower frame members.
Figure 22:
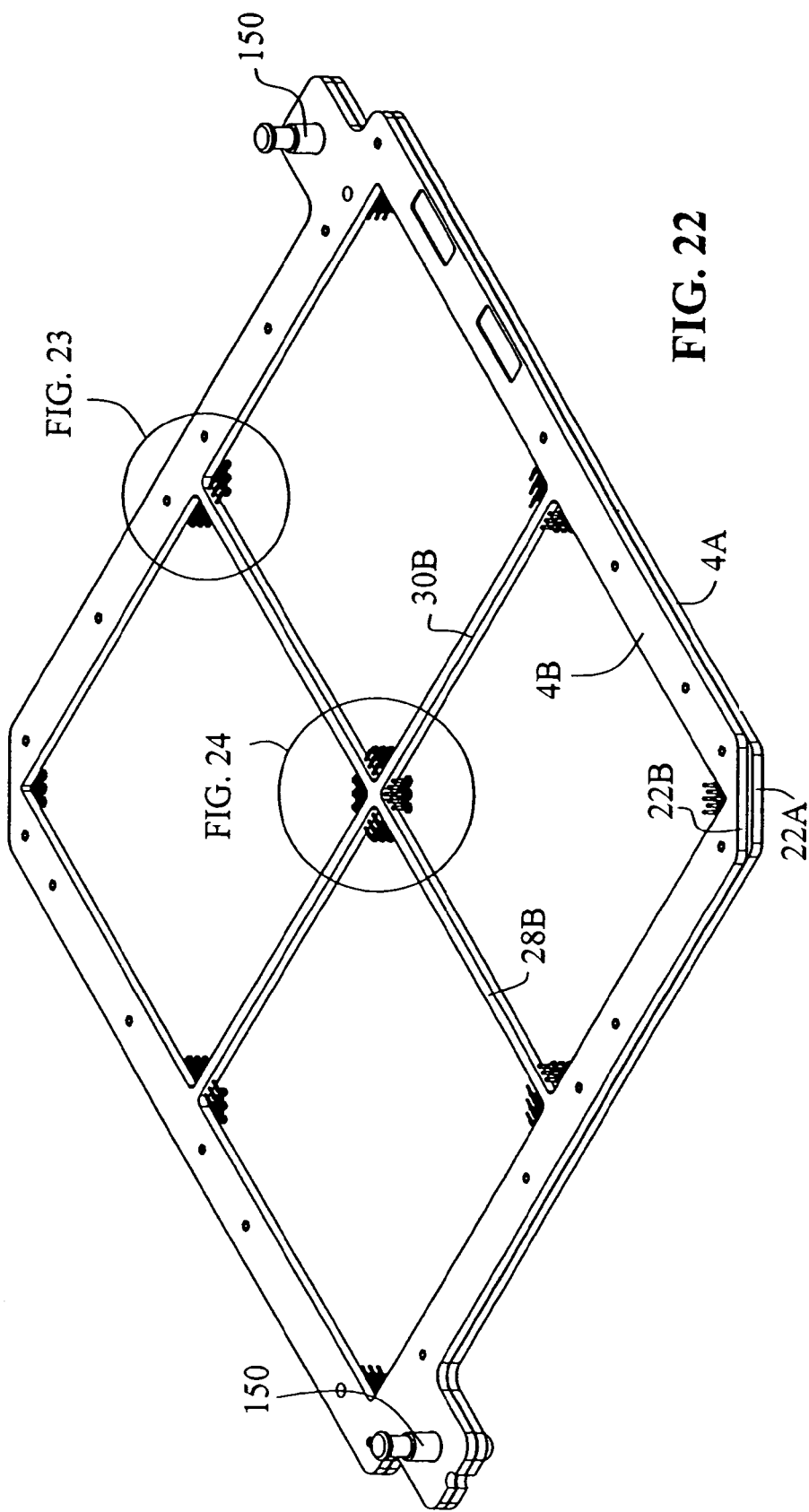
FIG. 22 is a view similar to that of FIG. 21 from the opposite side thereof.
Figure 23:
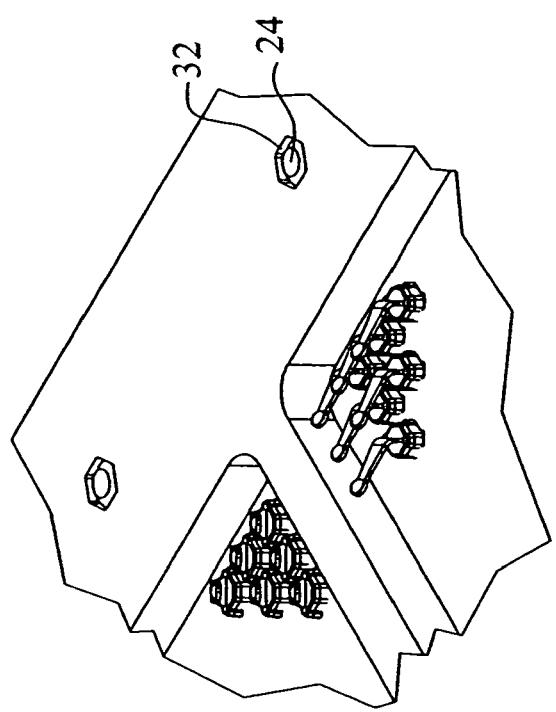
FIG. 23 is an enlarged view of a portion of the frame and contact members denoted in FIG. 22.

At this stage, all contact assemblies are inserted in, and the locating pins 150 are fixedly secured to, substrate 6. The frame housing members 4A and 4B may now be positioned with respective apertures 20A, 20B over the locating pins 150, which positions the frame support members 28A, 30A; 28B, 30B (FIGS. 4 and 5) intermediate the quadrants of contact assemblies, as best shown in FIGS. 21 and 22. The two frame housing members 4A and 4B are press-fit together, due to the interference fit between cylindrical pins 24 (FIG. 4) and their respective receiving apertures 32 (FIG. 8) to provide an interference fit between the cylindrical pin and hexagonal aperture, as best shown in the exploded view of FIG. 23.

Figure 24:
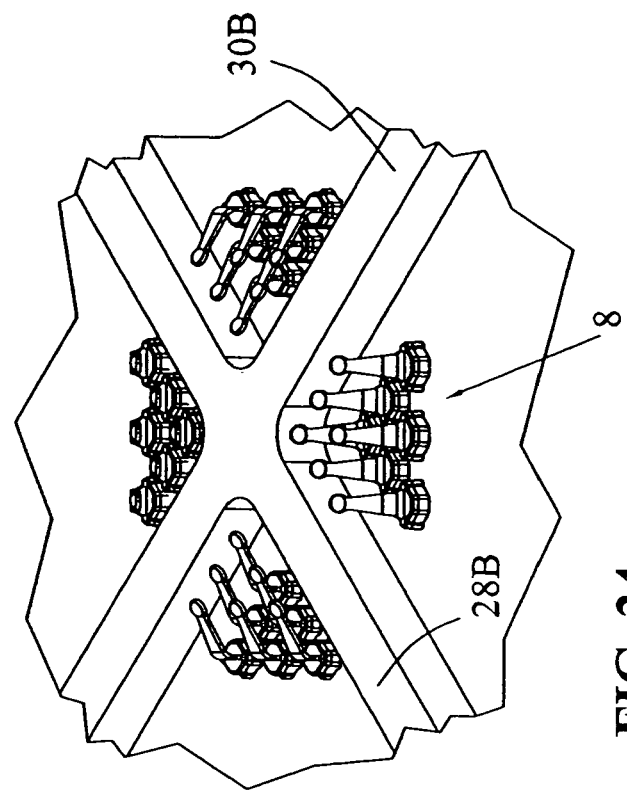
FIG. 24 shows an enlarged view of the central portion of the substrate denoted in FIG. 22.

As best shown in FIG. 24, the contact assemblies 8 are assembled in quadrants about the support members 28B and 30B to define an array of contacts for interconnection to a further electrical component. It should also be appreciated that the support members 28A, 30A; 28B, 30B act to both rigidify the substrate 6 as well as to provide for a positive stop position for the electrical component to which the LGA interconnect 2 is applied. Said differently, if the LGA interconnect 2 is applied intermediate to two printed circuit boards, the two circuit boards could be assembled to the interconnect 2, such that the two printed circuit boards are drawn together to a position where the circuit boards contact the support members 28A, 30A; 28B, 30B.

With reference again to FIGS. 21 and 22, it should be appreciated that the edges 22A overlap their respective edges 22B, thereby defining a latching edge. With the upper device now positioned against frame housing portion 4A, cover 5 can be positioned over the assembly of the frame housing 4 and substrate 5 and latches 6 (FIG. 6) can latch over the overlapping edge 22A, as best shown in FIG. 2, while at the same time, cylindrical pin portions 152 (FIG. 7) may be received in their receiving apertures 42 (FIG. 6) of cover 5. An underside perspective view of the embodiment as assembled is shown in FIG. 2, with the remainder of pin 150, and the reduced diameter portions 156 extending from the frame housing portion 4B for further alignment and connection to, a further electrical device.

Thus, in the embodiment of FIGS. 1–24, the contact assemblies 8 have enhanced retention to their substrate 6 by way of the slot 144 (FIGS. 11 and 12) being positioned against an edge of its respective aperture 90 (FIG. 15) which provides for a retention of the plastic insert 112 on both sides of the aperture 90, against respective surfaces 94 (FIG. 7). Furthermore, the support members 28A, 28B; 30A, 30B allow for proper positioning of an electrical component against the interconnect 2 providing adequate contact force, but preventing overstressing of the contact assemblies. Furthermore, and as best shown in FIG. 24, the contacts are arranged in quadrants such that all frictional components of forces cancel each other out, thereby preventing any lateral forces from being transferred to the interconnected component causing degradation of the electrical connection.

What is claimed is:

1. An LGA interconnect, for interconnection to further electrical components, said LGA interconnect comprising:
   a substrate having an array of contact receiving openings therein, and the substrate having a receiving aperture, the receiving aperture having a receiving portion which transitions into a locking portion,
   a plurality of contact assemblies positioned and retained in said substrate;
   a frame housing positioned around a periphery of said substrate; and
   alignment members projecting from said substrate, and extending through said frame housing, for aligning said substrate relative to at least one of the electrical components, the alignment members being insertable into said receiving portion and locked in place to said substrate by said locking portion.

2. The LGA interconnect of claim 1, wherein said alignment members are comprised of pins.

3. The LGA interconnect of claim 2, wherein said pins are attached at diametrically opposite positions of said substrate.

4. The LGA interconnect of claim 2, wherein said frame housing can laterally float relative to said pins.

5. The LGA interconnect of claim 4, wherein said frame housing is comprised of first and second frame parts attached to each other.

6. The LGA interconnect of claim 2, wherein said pin is substantially cylindrical.

7. The LGA interconnect of claim 6, wherein said receiving portion and said locking portion are substantially circular.

8. The LGA interconnect of claim 7, wherein said pin is rotated into said locked position.

9. The LGA interconnect of claim 8, wherein said pin includes an undercut groove, which, when aligned with said locking portion, allows transverse movement of said pin into said locking portion.

10. The LGA interconnect of claim 9, wherein said receiving aperture includes a channel section at the intersection of said receiving portion and said locking portion.

11. The LGA interconnect of claim 10, wherein said undercut groove includes flat edge portions defined by parallel chordal edges, profiled to be received in said channel section.

12. The LGA interconnect of claim 11, wherein said channel section is provided by straight edges extending between said receiving portion and said locking portion.

13. The LGA interconnect of claim 12, wherein one of said straight edges includes a transverse stop edge.

14. The LGA interconnect of claim 13, wherein an edge opposite said transverse stop edge is provided with a latch member, whereby when said pin is rotated to a position where one of said chordal edges abuts said transverse stop edge, the other of said chordal edges is locked in position against said latch member, and said pin is held longitudinally fixed to said substrate.

15. The LGA interconnect of claim 14, wherein said latch member is defined by an elongate latch member, etched from said substrate and extending part way into said locking portion.

* * * * *